United States Patent
Soegtrop

(10) Patent No.: US 8,593,309 B2
(45) Date of Patent: Nov. 26, 2013

(54) METHOD FOR EFFICIENT DECODING OF VARIABLE LENGTH CODES

(75) Inventor: Michael Soegtrop, Poing (DE)

(73) Assignee: Intel Mobile Communications GmbH, Neubiberg (DE)

( * ) Notice: Subject to any disclaimer, the term of this patent is extended or adjusted under 35 U.S.C. 154(b) by 48 days.

(21) Appl. No.: 13/307,064

(22) Filed: Nov. 30, 2011

(65) Prior Publication Data

US 2013/0135124 A1 May 30, 2013

(51) Int. Cl.
*H03M 7/40* (2006.01)

(52) U.S. Cl.
USPC .................................. 341/67; 341/50; 341/51

(58) Field of Classification Search
USPC ............................ 341/50, 51, 67; 375/240.23
See application file for complete search history.

(56) References Cited

U.S. PATENT DOCUMENTS

| 7,333,037 B2 | 2/2008 | Cheng |
| 7,388,914 B2 * | 6/2008 | Chujoh et al. ........... 375/240.23 |
| 7,847,711 B2 | 12/2010 | Niemi et al. |
| 2010/0189370 A1 | 7/2010 | Niemi et al. |

OTHER PUBLICATIONS http://en.wikipedia.org/wiki/Golomb_coding "Golomb coding"; Jun. 21, 2013; pp. 1-7; http://en.wikipedia.org/wiki/Talk: Golomb_coding "Talk: Golomb coding"; Jun. 21, 2013; pp. 1-3.

* cited by examiner

*Primary Examiner* — Jean B Jeanglaude

(57) ABSTRACT

A method, system, and computer program product for decoding a variable length code. A decoding module is configured to receive the variable length code. The variable length code is a plurality of bits. The decoding module is also configured to identify a number of times the lead bit is repeated consecutively at the beginning of the plurality of bits. The lead bit is predetermined to be one of a 1 or 0. The decoding module is also configured to identify a code word in a table of code words by using the number of times the lead bit is repeated.

18 Claims, 9 Drawing Sheets

| | 000 | 001 | 010 | 011 | 100 | 101 | 110 | 111 |
|---|---|---|---|---|---|---|---|---|
| 0: | 01 | 01 | 01 | 01 | 02 | 02 | 02 | 02 |
| 1: | 03 | 03 | 03 | 03 | 00 | 00 | 04 | 04 |
| 2: | 11 | 11 | 11 | 11 | 05 | 05 | 02 | 02 |
| 3: | 21 | 21 | 21 | 21 | 31 | 31 | 41 | 41 |
| 4: | 06 | 06 | 13 | 13 | 51 | 51 | 61 | 61 |
| 5: | 07 | 07 | 22 | 22 | 71 | 71 | 14 | 32 |
| 6: | 81 | 81 | 91 | 91 | a1 | a1 | 08 | 23 |
| 7: | 42 | 42 | b1 | b1 | c1 | c1 | 15 | 52 |
| 8: | d1 | d1 | f0 | f0 | 24 | 33 | 62 | 72 |

METHOD FOR EFFICIENT DECODING OF VARIABLE LENGTH CODES

TECHNICAL FIELD

Aspects of this disclosure relate generally to decoding. In particular, an aspect of this disclosure relates to decoding variable length codes.

BACKGROUND

The growing computational complexity and data rate requirements of new multimedia applications demand that signal processing systems provide efficient and flexible compression and decompression routines. Encoding is a technique used to compress media files such as image and video files. An example of an image coding and decoding standard that may be used in various user devices is Joint Photographic Experts Group (JPEG.

The JPEG standard utilizes a lossy compression technique for compressing still images based on the discrete cosine transform (DCT) and the inverse discrete cosine transform (IDCT) for coding and decoding operations respectively. In the JPEG standard an 8×8 array of sample data, known as a data block, may be used for processing, where the sample data may correspond to luminance (Y) or chrominance (Cr and Cb) information of the still image signal. Four 8×8 blocks of luminance, an 8×8 block of Cr, and an 8×8 block of Cb data is known in JPEG terminology as a minimum coded unit (MCU). This type of JPEG encoding is referred to as YUV420. There are other types of JPEG encoding, such as, for example, YUV444.

In addition, decoding operations specified by, for example, the JPEG standard, may utilize computation-intensive algorithms, such as a Huffman decoding algorithm, which is a variable length coding (VLC) technique. In this regard, Huffman decoding may utilize a large portion of on-chip computing and/or memory resources, which may increase processing time and decrease overall system efficiency.

Therefore, it would be advantageous to have a method, system, and computer program product that addresses one or more of the issues discussed above.

SUMMARY

A method for decoding a variable length code. The method comprises receiving the variable length code. The variable length code is a plurality of bits. Then, the method identifies a number of times a lead bit is repeated consecutively at the beginning of the plurality of bits. The lead bit is predetermined to be one of a 1 or 0. Next, the method identifies a code word in a table of code words by using the number of times the lead bit is repeated.

A system for decoding a variable length code. The system comprises a memory unit, a processing unit connected to the memory unit, and a decoding module. The decoding module is configured to receive the variable length code. The variable length code is a plurality of bits. The decoding module is also configured to identify a number of times the lead bit is repeated consecutively at the beginning of the plurality of bits. The lead bit is predetermined to be one of a 1 or 0. The decoding module is also configured to identify a code word in a table of code words by using the number of times the lead bit is repeated.

A computer program product comprising logic encoded on a tangible media for decoding a variable length code. The logic comprises instructions for receiving the variable length code. The variable length code is a plurality of bits. The logic also comprises instructions for identifying a number of times a lead bit is repeated consecutively at the beginning of the plurality of bits. The lead bit is predetermined to be one of a 1 or 0. The logic also comprises instructions for identifying a code word in a table of code words by using the number of times the lead bit is repeated.

BRIEF DESCRIPTION OF THE DRAWINGS

In the drawings, like reference characters generally refer to the same parts throughout the different views. The drawings are not necessarily to scale. In the following description, aspects of this disclosure are described with reference to the following drawings, in which.

DETAILED DESCRIPTION

The following detailed description refers to the accompanying drawings that show, by way of illustration, specific details and aspects of this disclosure. The word "exemplary" is used herein to mean "serving as an example, instance, or illustration". Any aspect of this disclosure or design described herein as "exemplary" is not necessarily to be construed as preferred or advantageous over other aspects of this disclosure or designs.

Figure 1:
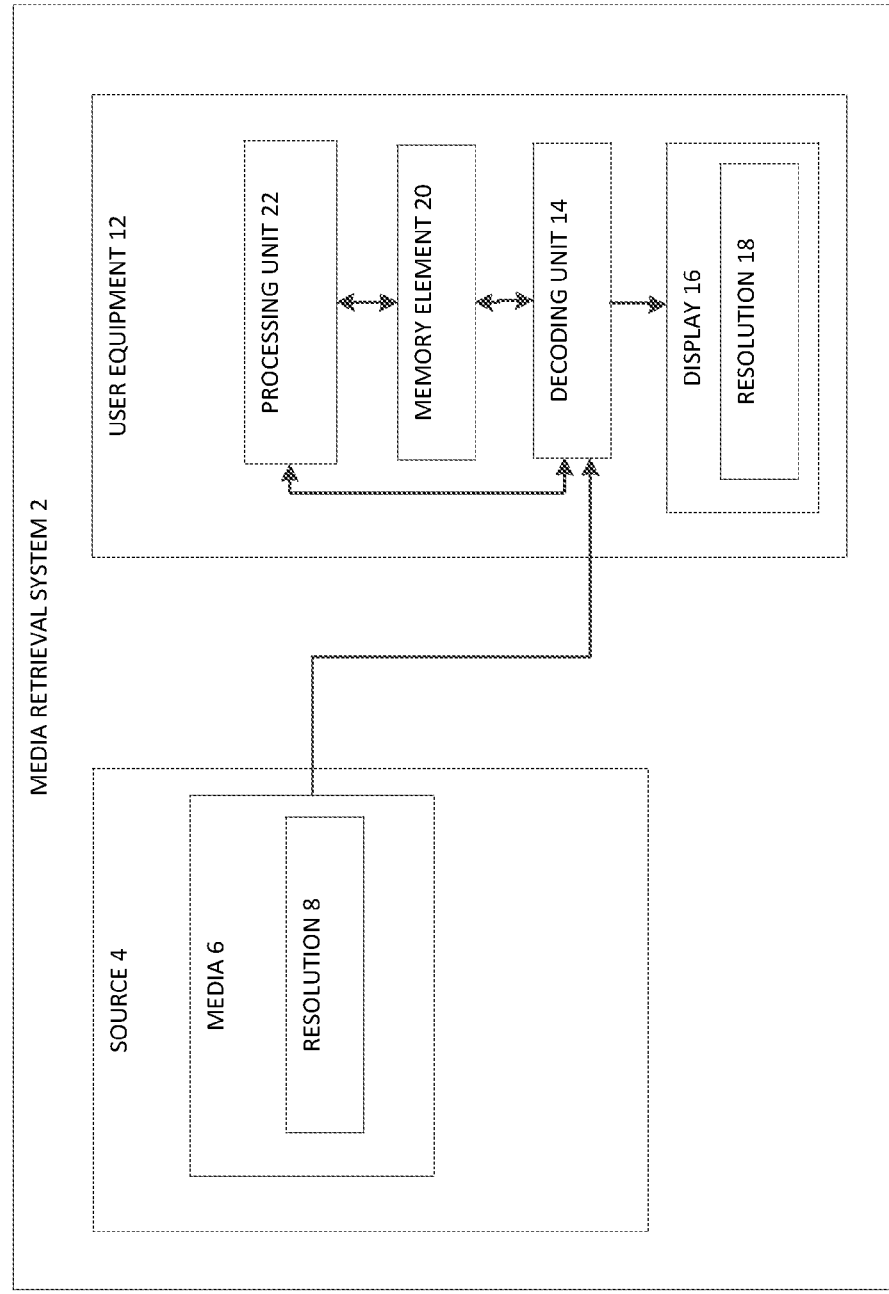
FIG. 1 is a block diagram of an media retrieval system in accordance with an aspect of this disclosure.

FIG. 1 is a block diagram of a media retrieval system in accordance with an aspect of this disclosure. Media retrieval system 2 comprises source 4 and user equipment 12. In an aspect of this disclosure, Source 4 comprises media 6 and may be connected to user equipment through a wired connection and/or wirelessly. In another aspect of this disclosure, source 4 may also be part of user equipment 12. User equipment 12 includes display 16 for displaying media 6.

In an aspect of this disclosure, source 4 comprises media 6 with resolution 8. Source 4 may be a website on the internet, a memory source such as a memory card or hard drive, user equipment such as a mobile device or laptop, or another type of source. In another aspect of this disclosure, source 4 may be memory in user equipment 12. For example, source 4 may be an image that was captured using a camera on user equipment 12. Media 6 may be a video or image. Media 6 may be encoded with any coding type. For example, media 6 may be encoded with JPEG, MPEG, H.264, or some other type of media coding type.

Media 6 has resolution 8. Resolution 8 may be the native resolution of media 6. For example, in an aspect of this disclosure, resolution 8 may be SVGA (Super Video Graphics Array) which has a resolution of 800×600. Resolution 8 may be any resolution, including, but not limited to, QVGA, VGA, SVGA, XGA, WXGA, and other types of resolution.

In an aspect of this disclosure, user equipment 12 comprises decoding unit 14 for decoding media 6. User equipment 12 also includes display 16 with resolution 18. In an aspect of this disclosure, user equipment 12 may be a device that includes a decoding unit. For example, user equipment 12 may be, but not limited to, a laptop, tablet computer, mobile phone, camera, or any other type of device containing a decoding unit. In an aspect of this disclosure, user equipment 12 may be a device without a decoding unit as long as user equipment 12 has access to a decoding unit. Additionally, user equipment 12 may be able to access media files. For example, user equipment 12 may be configured to access a media file through the Internet, a storage device connected to user equipment 12, a device accessed wirelessly, through the use of a camera on user equipment 12, and/or some other suitable source 4 of media 6.

In an aspect of this disclosure, decoding unit 14 is a device which does the reverse operation of an encoder, undoing the encoding so that the original information can be retrieved. Decoding unit 14 may be configured to decode a bit stream of data that has been encoded. In an aspect of this disclosure, the data has been encoded using a Huffman coding technique. The data may be media, such as an image file.

In an aspect of this disclosure, user equipment 12 may display media 6 through the use of display 16. Display 16 may be a monitor and/or any other type of display device. Display 16 has resolution 18. In an aspect of this disclosure, resolution 18 may be QVGA (Quarter Video Graphics Array) which has a resolution of 320×240. However, resolution 18 may be any resolution, including, but not limited to, QVGA, VGA, SVGA, XGA, WXGA, and other types of resolution.

Additionally, user equipment 12 may include one or more memory elements (e.g., memory element 20) for storing information to be used in achieving operations associated with applications management, as outlined herein. These devices may further keep information in any suitable memory element (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. Any of the memory or storage items discussed herein should be construed as being encompassed within the broad term 'memory element' as used herein.

Furthermore, the operations for decoding variable length codes herein may be implemented by logic encoded in one or more tangible media, which may be inclusive of non-transitory media (e.g., embedded logic provided in an application specific integrated circuit (ASIC), digital signal processor (DSP) instructions, software potentially inclusive of object code and source code to be executed by a processor or other similar machine, etc.). In some of these instances, one or more memory elements (e.g., memory element 20) can store data used for the operations described herein. This includes the memory elements being able to store software, logic, code, or processor instructions that are executed to carry out the activities described herein.

Additionally, user equipment 12 may include processing unit 22. Processing unit 22 may be a processor, multi-core processor, single core process, micro controller, controller circuit, or any other type of processing device. A processing unit can execute any type of instructions associated with the data to achieve the operations detailed herein. In one aspect of this disclosure, the processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, an EPROM, an EEPROM), or an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

The illustration of media retrieval system 2 in FIG. 1 is not meant to imply physical or architectural limitations to the manner in which an aspect of this disclosure may be implemented. Other components in addition and/or in place of the ones illustrated may be used. Some components may be unnecessary in an aspect of this disclosure. Also, the blocks are presented to illustrate some functional components. One or more of these blocks may be combined and/or divided into different blocks when implemented in an aspect of this disclosure. For example, in an aspect of this disclosure, source 4 may be located within user equipment 12.

Figure 2:
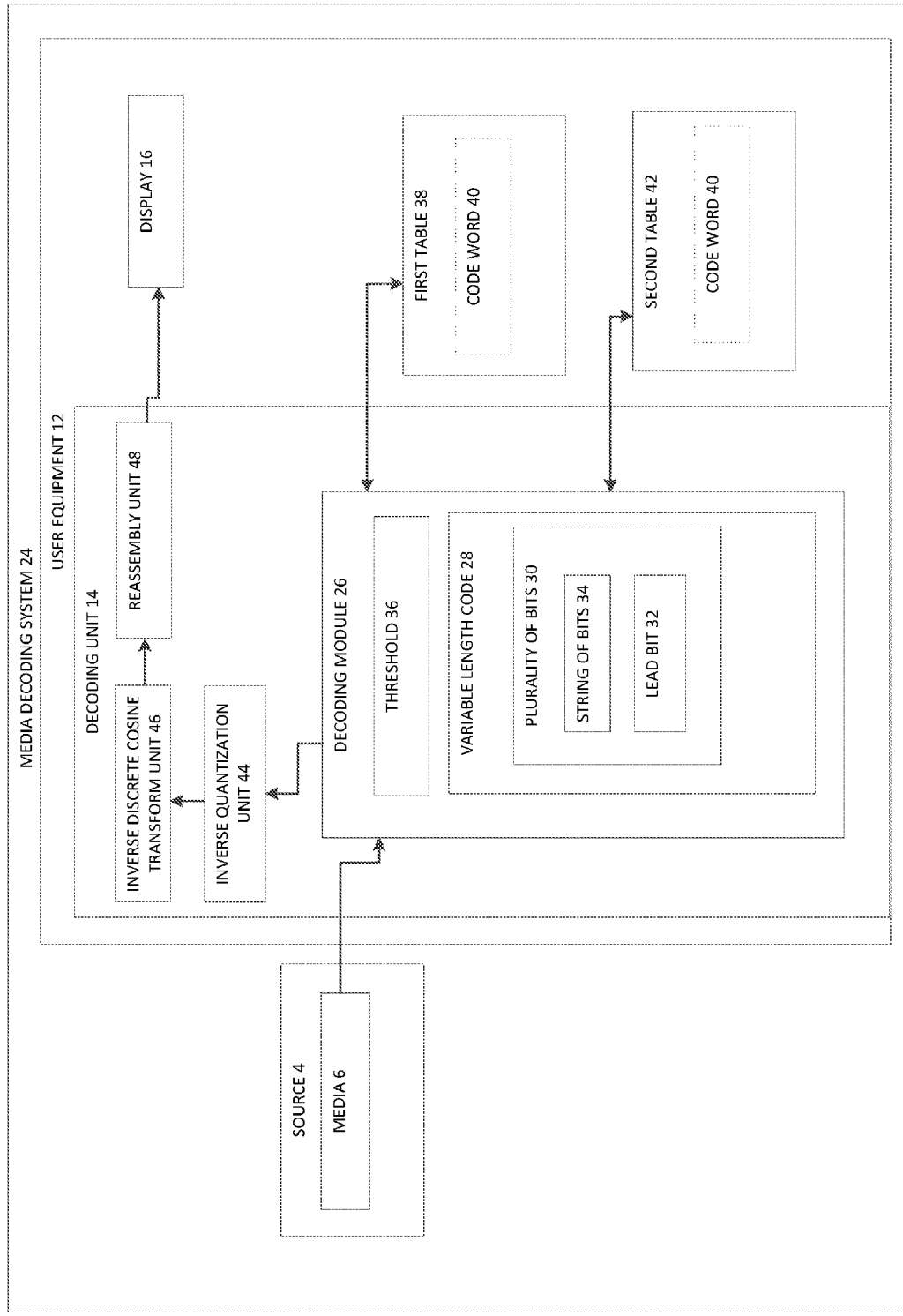
FIG. 2 is a block diagram of an media decoding system in accordance with an aspect of this disclosure.

FIG. 2 is a block diagram of a media decoding system in accordance with an aspect of this disclosure. Media decoding system 24 comprises source 4 and user equipment 12. Media decoding system 24 is a system that can decode a media file and display the decoded media file.

In an aspect of this disclosure, user equipment 12 comprises decoding unit 14, display 16, first table 38, and second table 42. Decoding unit 14 may comprise decoding module 26, inverse quantization unit 44, inverse discrete cosine transform unit 46, and reassembly unit 48.

In an aspect of this disclosure, decoding unit 14 may be an entropy decoder. An entropy decoder may comprise a data expansion method by which a previously encoded symbol is decoded. In an aspect of this disclosure, decoding unit 14 may decode data that has been encoded using a Huffman encoder. However, other types of encoders may be decoded, such as arithmetic encoders, Fibonacci encoders, as well as other encoders.

In an aspect of this disclosure, inverse quantization unit 44 may be configured to identify a numerical value based on a binary value. The numerical value may comprise a base 10 representation of the binary value. In another aspect, inverse quantization unit 44 may convert numeric values into other numeric values, irrespective of the representation of the numeric values. For example, if a quantization unit multiplies a number by three, inverse quantization unit 44 may divide the number by three.

In an aspect of this disclosure, inverse discrete cosine transform unit 46 may perform an inverse discrete cosine transform on the received block of numerical values from the inverse quantization unit 44. The received block of numerical values may comprise a frequency representation of the YUV color space information associated with an 8×8 block. Inverse discrete cosine transform unit 46 may be part of post-processing.

The 8×8 block may comprise pixels arranged in rows and columns where each row may comprise 8 pixels. Each of the pixels may comprise YUV information. The YUV information may be retrieved from memory and converted to an RGB representation during post processing. In another aspect, JPEG may not be limited to YUV. For example, JPEG may be encoded in an RGB color model.

In an aspect of this disclosure, when media 6 is an image, the image is divided up into 8×8 blocks of pixels. After receiving the information from inverse discrete cosine transform unit 46, with possible other steps performed in between, the reassembly block puts the 8×8 blocks into order to form the image. The image is eventually forwarded to display 16 for display of the image on, for example, a monitor.

The illustration of decoding module 26, inverse quantization unit 44, inverse discrete cosine transform unit 46, and reassembly unit 48 are not meant to imply physical or architectural limitations to the manner in which an aspect of this disclosure may be implemented. Other components in addition and/or in place of the ones illustrated may be used. For example, there may be components used in the process of decoding that are not illustrated. For example, a color transform unit, an up-sampling unit, post-processing unit, bit unpacker, inverse zig zag unit, and other units are not illustrated but may be used in conjunction with an aspect of this disclosure.

In an aspect of this disclosure, decoding module 26 may receive a bit stream that has been encoded with a type of encoder, for example, a Huffman encoder. Decoding module 26 may comprise variable length code 28 and threshold 36. Variable length code 28 may be part of the bit stream coming from source 4. There may be other bits after and before variable length code 28.

In an aspect of this disclosure, variable length code 28 comprises plurality of bits 30. Plurality of bits 30 may further comprise string of bits 34 and lead bit 32. Lead bit 32 may be the type of bit that is predetermined to be at the beginning of variable length code 28. For example, lead bit 32 may be a "1". Decoding module 26 may be configured to count the number of lead bits at the beginning of variable length code 28. Decoding module 26 may also be configured to compare the number of lead bits with threshold 36. Based on the comparison, decoding module 26 may access first table 38 or second table 42.

In an aspect of this disclosure, first table 38 and second table 42 comprise code words, such as code word 40. Code word 40 may be associated with variable length code 26.

Decoding module 26 may be implemented as software or hardware. When implemented as software, decoding module 26 may use computer code to identify code words and access first table 28 and second table 42. An example of code, in the form of pseudo code, may appear as follows:

```
vlc = <vlc code to process, left aligned in a 32 bit word>
table = <decoding table >
code = <decoded code>
ones = <count leading ones> (vlc);
If (ones < 9)
    {
    code = table [8*ones + ((vlc >> (28-ones)) & 7)];
    }
Else
    {
    code = table [9*8 + ((vlc >> 16) & 127)];
    }
```

In the pseudo code above, the program identifies the number of ones, and then identifies the code using the appropriate table. The pseudo code identifies whether a number of times a lead bit is repeated consecutively at the beginning of the plurality of bits with the code "(ones<9)". Here, the threshold is 9.

If the "ones" were less than or equal to 8, then a first table is used with the pseudo code "code=table [8*ones+((vlc>> (28-ones)) & 7)]". If the "ones" were less than or equal to 8, then a second table is used with the "else" command of the pseudo code and the table is represented as "code=table [9*8+vlc>>16) & 127]".

In the pseudo code above, C-language operators are used. In general, the code may be:

```
threshold = <max number of leading "1" bits>
addbits = <number of additional bits of VLC code used to index first
    table>
vlc = <vlc code to process, left aligned in a 32 bit word>
table = <decoding table>
code = <decoded code>
ones = <count leading ones> (vlc);
If (ones <=threshold)
    {
    code = table [(1<<addbits)*ones + ((vlc >> (32 − addbits − 1 −
    ones)) & ((1<<addbits) − 1))];
    }
Else
    {
    code = table [threshold*(1<<addbits) + ((vlc >> 16) &
    & ((1<<addbits) −((1<<(16 − threshold)) − 1))];
    }
```

Here, threshold and addbits may be constants. The pseudo code identifies whether a number of times a lead bit is repeated consecutively at the beginning of the plurality of bits with the code "(ones<=threshold)". The threshold may be a constant, such as, for example, "8".

If the "ones" were less than or equal to 8, then a first table is used with the pseudo code "code=table [(1<<addbits) *ones+((vlc>>(32−addbits−1−ones)) & ((1<<addbits)−1))]". If the "ones" were less than or equal to 8, then a second table is used with the "else" command of the pseudo code and the table is represented as "code=table [(threshold+1)*(1<<addbits)+((vlc>>16) & ((1<<(16−threshold−1))−1))]".

The expression "32-addbits-1-ones" is the number of unused bits, which is shifted away. The word has 32 bits. The number of leading ones (ones) is subtracted from the word. Then, 1 is subtracted for a "0" bit following the ones. Then, the number of additional bits is subtracted.

The expression "16—threshold" is the maximum number of bits remaining in the code if a threshold number or more leading "1" bits are found. The maximum code length defined in the JPEG standard is sixteen bits.

The illustration of media decoding system 12 in FIG. 2 is not meant to imply physical or architectural limitations to the manner in which an aspect of this disclosure may be implemented. Other components in addition and/or in place of the ones illustrated may be used. Some components may be unnecessary in an aspect of this disclosure. Also, the blocks are presented to illustrate some functional components. One or more of these blocks may be combined and/or divided into different blocks when implemented in an aspect of this disclosure. For example, in an aspect of this disclosure, source 4 may be located within user equipment 12.

The aspects of this disclosure may provide for decoding a VLC by using the number of leading "1" bits. The VLC codes in JPEG coding usually consist of a sequence of "1" bits plus a small number of additional bits, in most cases three or less. Thus, it is possible to decode the VLC coding by first finding the number of leading "1" bits and then indexing a table with the number of leading "1" bits and the three extra bits. This table is much smaller than a complete code word table. In JPEG, the maximum code length is 16 bit, so a complete code table has 64 kB or more. Most modern processors are able to determine the number of leading zeros in a word in a single cycle so that the number of leading "1" bits can be determined quickly. A JPEG decoder using this method is in important use cases a factor of two faster than a JPEG decoder using previously known methods. In a practical implementation, we use this method for up to eight leading "1" bits. In the case of nine or more leading "1" bits, the code can have at most seven additional code bits because the maximum code length defined by the JPEG standard is sixteen bits. For these seven bits, we use a complete table with 128 entries. So the complete table has a size of 72 (9 times 8) plus 128 bytes which equals 200 bytes. The "9" is for the possibilities of 0 to 8 leading "1" bits and the "8" is for the various combinations of a three bit binary code. Additionally, the leading "1" bits may be followed by a single "0" bit which is then followed by three bits which are used for the code word location in a table. In the case of more than eight leading "1" bits, a "1" bit may follow the first nine bits. Therefore, the number of bits which follow is different based on the number of leading "1" bits.

A mobile phone may have a 1600×1200 (2 MP) pixel camera resolution and a 320×240 pixel (QVGA) display or a mobile phone may have a 3200×2400 (8 MP) camera and a 640×480 pixel (VGA) display. In both cases the ratio between number of pixels of the camera and the display is 25. This means that whenever an image taken with the camera is displayed, only 4% of the information in the image may be displayed while 96% of the information in the image may be discarded. If the image is displayed full screen, fine detail encoded in high frequency coefficients in the DCT may be discarded. When a zoom-in of the image is displayed, clipped macro-blocks may be discarded. In both cases the discarding means that the corresponding DCT coefficients in the encoded image may be skipped.

The aspects of this disclosure take into account that due to the nature of variable length coding, the encoded size of a DCT coefficient may not be known without decoding the VLC code. This means that VLC decoding may be used for skipping discarded high frequency coefficients and clipped macro blocks. Since only 4% of the image is visible, VLC decoding only needs to be done for 96% of the image information, while 4% of the image information may need full processing. This makes the speed of the VLC decoding important for the speed of the whole decoding process.

The aspects of this disclosure take into account that when doing a searching in a complete table of every VLC, the time it takes to do the search is logarithmic in function. The aspects of this disclosure also take into account that using a full code table can be costly in terms of the time it takes to do a search as well as using the processor more extensively compared to aspects of this disclosure.

The aspects of this disclosure take into account that using a complete table with a maximum code length may be larger than a processor memory cache, such as, for example, an L1 cache. The complete table may have an expanded code at 16 bits for every VLC. The table is then formed based off of the 16 bit VLC codes. In this table, for example, the VLC code of 00 may be found 16,384 times. This type of table may require 64 kB of memory to load. In many circumstances, the L1 cache for a mobile phone is less than 64 kB.

The aspects of this disclosure take into account a combination of the above two tables may be used. In this aspect, an 8 bit table may first be used for those codes 8 bits and below. Then, a second search is done for those codes above 8 bits by doing the binary intersection search in a full table of codes.

The aspects of this disclosure may provide for using the number of leading 1 bits in the code to construct a small one-step look up table. The number of leading 1 bits in the VLC are used to index the look up table.

The aspects of this disclosure may take into account that some current methods use additional tables in JPEG headers to skip parts of the VLC. This process may be used in decoding when doing zoom-out decoding. This method requires generation of the tables, which means a modification to hardware JPEG encoders is needed.

The aspects of this disclosure provide for a mechanism to use a 9×8 entry table for 0 to 8 leading 1 bit VLCs with eight entries for three additional bits. A 0 bit may follow the leading 1 bits. The three additional bits may follow the 0 bit. There may be an additional 128 entry table for the VLCs with nine or more leading 1 bits. The result is a 72 plus 128 table which is equal to 200 bytes. This table size is much smaller than a 64 kB table and may fit within a processor memory cache on a mobile phone. This aspect may provide for less unpredictable branches and a simple look up table for even the longest codes.

For high resolution images common these days, software decoding may take a considerable amount of time. The aspects of this disclosure may decode 2 megapixel images within 300 ms on a 208 MHz processor. A previous decoder, one currently in use, decoded the 2 megapixel image in 1.2 seconds. This is four times longer than the decoder disclosed in the aspects of this disclosure.

The foregoing has outlined rather broadly the features and technical advantages of the different aspects of this disclosure in order for the detailed description that follows may be better understood. Additional features and advantages of the aspects of this disclosure will be described hereinafter. It should be appreciated by those skilled in the art that the conception and the specific aspects disclosed may be readily utilized as a basis for modifying or redesigning other structures or processes for carrying out the same purposes of the different aspects of this disclosure. It should also be realized by those skilled in the art that such equivalent constructions do not depart form the spirit and scope as set forth in the appended claims.

Figure 3:
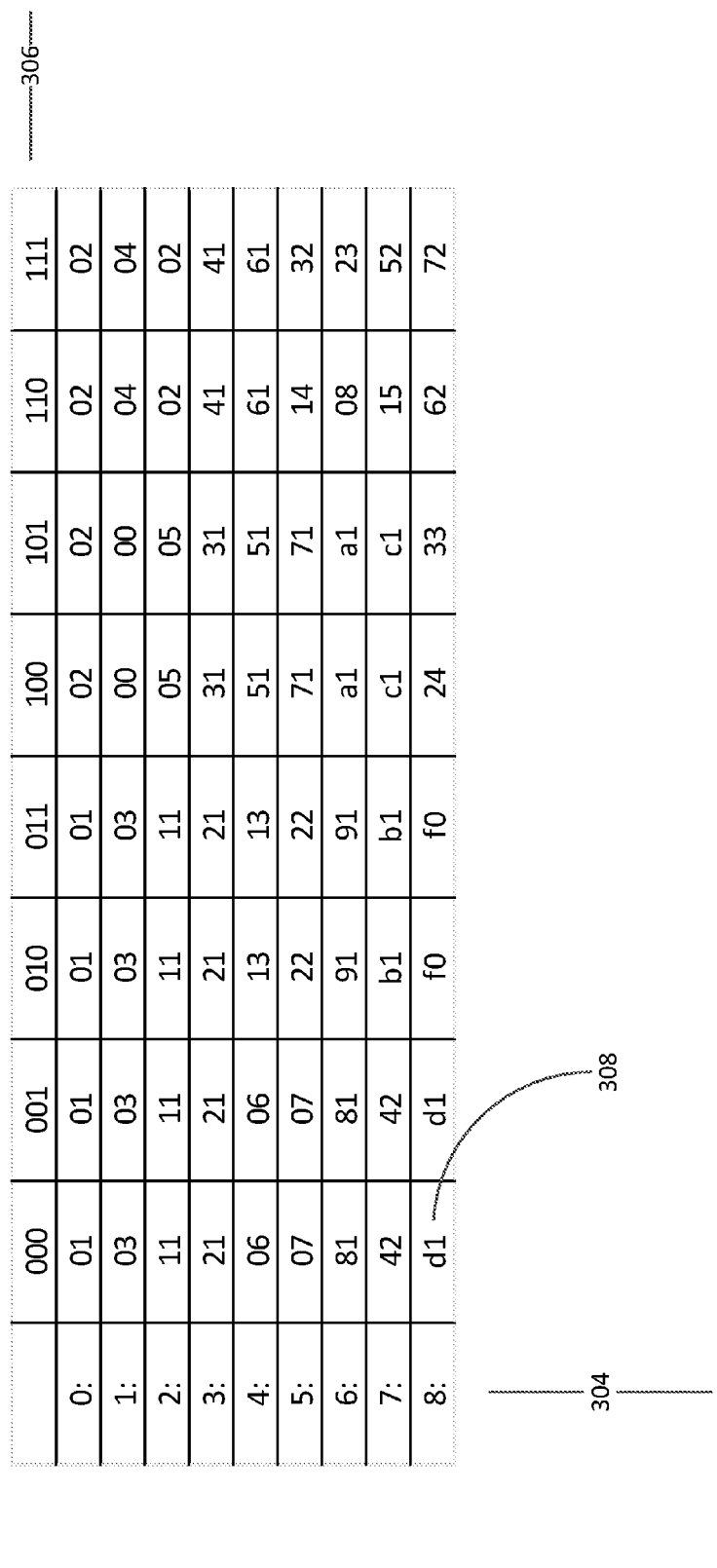
FIG. 3 is a code word table in accordance with an aspect of this disclosure.

FIG. 3 is a code word table in accordance with an aspect of this disclosure. Table 302 comprises axis 304, axis 306, and a plurality of code words, such as code word 308. Table 302 may be one example of first table 38 as shown in FIG. 2. Table 302 may be accessed by decoding module 26. Also, table 302 may be kept in a storage device, memory, processor memory, and/or any other suitable storage medium.

In an aspect of this disclosure, axis 304 has the numbers 0 to 8. These numbers may represent the number of leading bits in a VLC. For example, in the VLC of 11111001, the number of leading bits, if set to a 1, is five. There are five "1" bits that begin the VLC and are consecutive. In this example, the number is five. Therefore, the number selected on axis 304 would be "5". In another example, in the VLC of 01, the number of leading bits, if set to a 0, is zero. There is a "0" bit that begins the VLC, therefore no leading bits of "1" exist in this VLC. In this example, the number is zero. Therefore, the number selected on axis 304 would be "0". In other aspects of this disclosure, the numbers on axis 304 may be different and/or may go up to higher numbers.

In an aspect of this disclosure, axis 306 has the numbers 0 to 7, represented in binary form. For example, the binary form of 5 is 101. These numbers may represent a string of bits in a VLC. In an aspect of this disclosure, for example, in the VLC of 11111001, the first five bits are 1's and are leading bits. Then, the next bit of 0 is an indicator that the leading bits are done. After the indicator bit are the string of bits. In this example, the string of bits is the bits 01. In an aspect of the disclosure, the string of bits is three bits. Therefore, the next bit in the bit stream after the VLC to form 01X where X represents a 1 or 0. Therefore, either 010 or 011 will be selected on axis 306. As can be seen, the code word 308 for both columns is the same for each number selected in axis 304. For example, if "5" is selected in axis 304, then code word 308 for both 010 and 011 is "22". In other aspects of this disclosure, the numbers on axis 306 may be different and/or may go up to higher numbers.

In an aspect of this disclosure, when the threshold is 9, axis 304 will be the numbers 0-8 and axis 306 will be the binary value of 0-7 (000, 001, 010, 011 . . . etc.). Using the examples above, code word 308 is 22.

Figure 4:
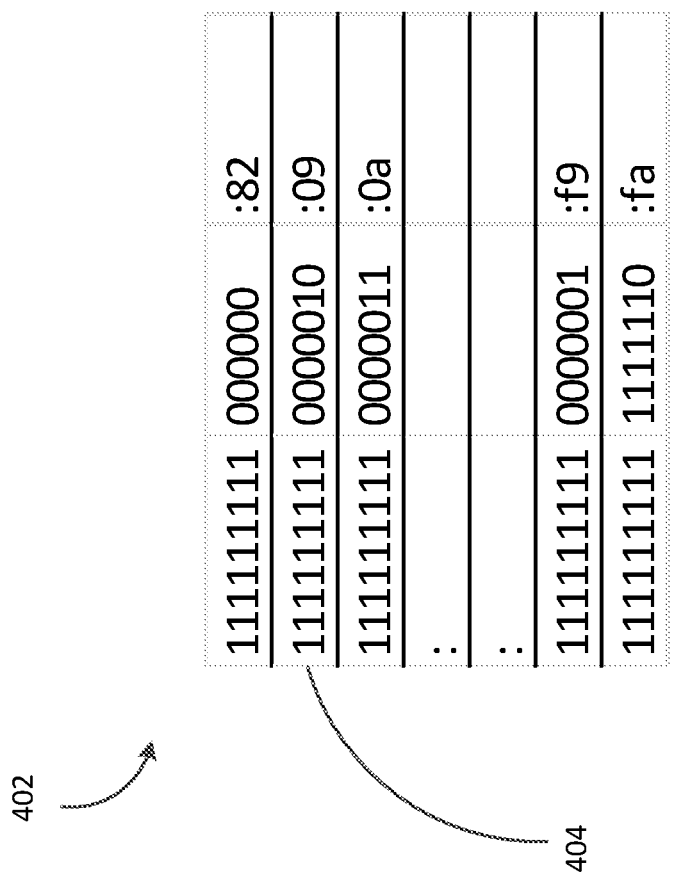
FIG. 4 is a code word table in accordance with an aspect of this disclosure.

In contrast, a Huffman table may be a set of bits followed by a code word and a process must filter through each line to identify the code word. For example, a Huffman table may be similar to one as listed in ISO/IEC 10918-1:1993(E) standard, Table K.5. FIG. 4 is a code word table in accordance with an aspect of this disclosure.

The standard table, sorted by code, in part, is shown here:
00 :0x01
01 :0x02
100 :0x03
1010 :0x00
1011 :0x04
1100 :0x11
11010 :0x05
11011 :0x12
11100 :0x21
111010 :0x31
111011 :0x41
1111000 :0x06
1111001 :0x13
:
1111111111111101 :0xf9
1111111111111110 :0xfa This table, once split based on leading "1" bits is partially shown here:

0 leading 1 bits, 1 0 bit, up to 1 extra bit:
0 0 :0x01
0 1 :0x02
1 leading 1 bits, 1 0 bit, up to 2 extra bits:
1 0 0 :0x03
1 0 10 :0x00
1 0 11 :0x04
2 leading 1 bits, 1 0 bit, up to 2 extra bits:
11 0 0 :0x11
11 0 10 :0x05
11 0 11 :0x12
3 leading 1 bits, 1 0 bit, up to 2 extra bits:
111 0 0 :0x21
111 0 10 :0x31
111 0 11 :0x41
:
:
9 or more leading 1 bits plus up to 7 bits to maximum code length 16:
111111111 000000 :0x82
111111111 0000010 :0x09
:
:
111111111 1111100 :0xf8
111111111 1111101 :0xf9

Table 402 comprises entries, such as entry 404, and a plurality of code words, such as code word 406. Table 402 may be one example of second table 42 as shown in FIG. 2. Table 402 may be accessed by decoding module 26. Also, table 402 may be kept in a storage device, memory, processor memory, and/or any other suitable storage medium.

In an aspect of this disclosure, table 402 has entries of VLCs and their respective code words. For example, entry 404 has the VLC of 1111111110000010 and code word 406 of 09. In an aspect of this disclosure, for example, in the VLC of 1111111110000011, the first nine bits are 1's and are leading bits. After the lead bits is the string of bits. In this example, the string of bits is the bits 0000011.

In an aspect of this disclosure, the string of bits is always the bits, up to seven, following the first nine bits. In another aspect, the string of bits may be a different size. For example, when the threshold is 9, all of the entries in the table will have at least nine 1's at the beginning. The string of bits may be matched with the bits following the nine leading bits. For example, 0000011 will be matched with the entry for 1111111110000011. In another example, the full VLC may be matched with an entry. For example, 1111111110000011 will be matched with the full entry of 1111111110000011. Table 402 may have a different number of entries depending on what a threshold is set to, such as threshold 36 from FIG. 2.

Figure 5:
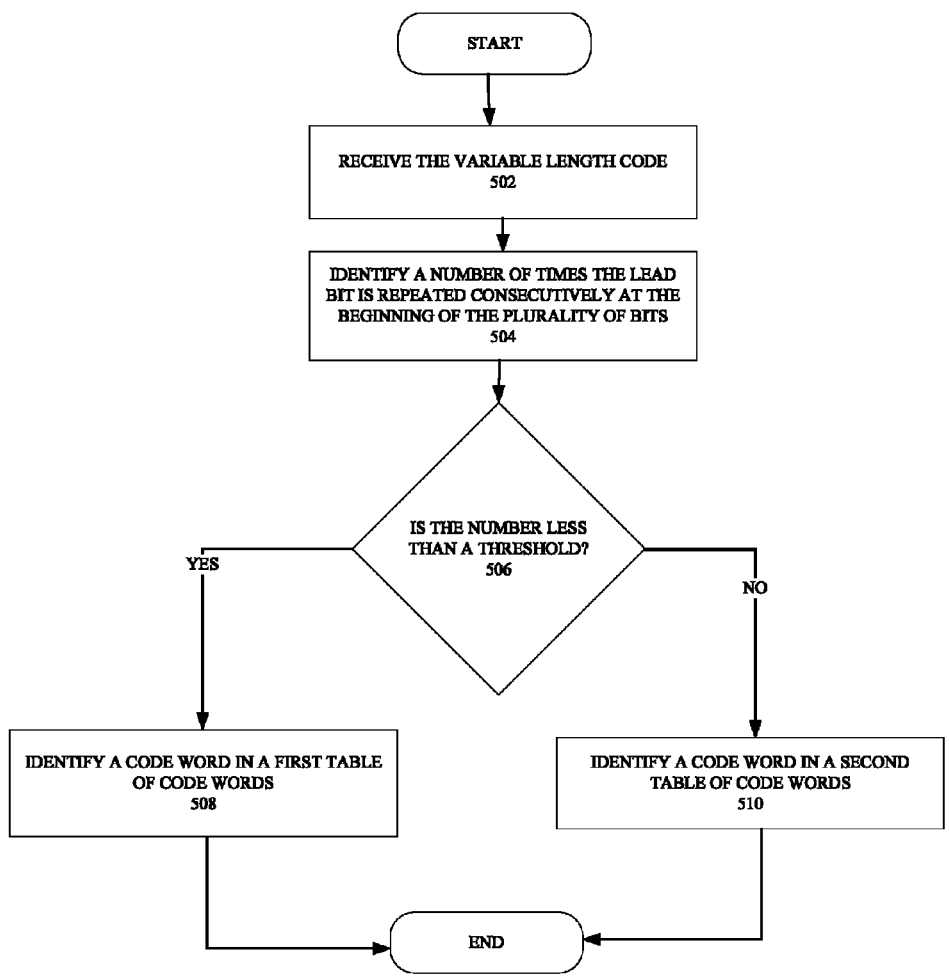
FIG. 5 is a flowchart for decoding a variable length code in accordance with an aspect of this disclosure.

FIG. 5 is a flowchart for decoding a variable length code in accordance with an aspect of this disclosure. Process 500 may be implemented in media decoding system 24 from FIG. 2.

Process 500 begins with a decoding module may be configured to receive the variable length code, wherein the variable length code is a plurality of bits (step 502). Next, the decoding module may identify a number of times the lead bit is repeated consecutively at the beginning of the plurality of bits (step 504). The lead bit may be predetermined to be one of a 1 or 0. In an aspect of this disclosure, the lead bit is a 1.

Then, a determination is made as to whether the number is less than a threshold (step 506). In an aspect of this disclosure, the threshold is 9. If the number is less than a threshold, the decoding module may identify a code word in a first table of code words (step 508). Therefore, in an aspect of this disclosure, if the number of lead bits (e.g. 1) is less than 9, then the first table is used. For example, if the 16-bit number is 1111101001011101 then the decoding module would access the first table to find the code word associated with this number. The first table may be table 302 as shown in FIG. 3. In this example, using the table in FIG. 3, the code word would be 71.

Alternatively, if the number is not less than the threshold, the decoding module may identify the code word in a second table of code words (step 510). Therefore, in an aspect of this disclosure, if the number of lead bits (e.g. 1) is equal to or greater than 9, then the second table is used. For example, if the 16-bit number is 1111111110000011 then the decoding module would access the second table to find the code word associated with this number. The second table may be table 402 as shown in FIG. 4. In this example, using the table in FIG. 4, the code word would be 0a. Thereafter, the process terminates.

Figure 6:
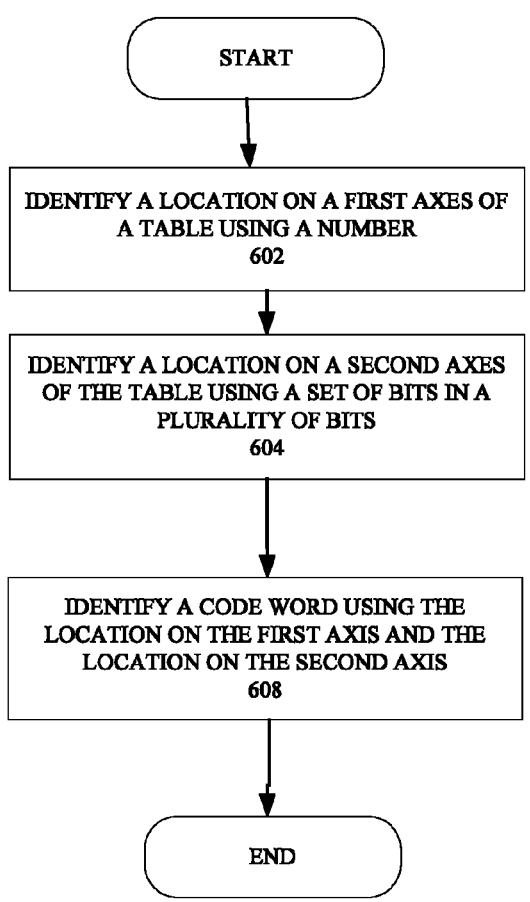
FIG. 6 is a flowchart for locating a code word in a table in accordance with an aspect of this disclosure.

FIG. 6 is a flowchart for locating a code word in a table in accordance with an aspect of this disclosure. Process 600 may be implemented in media decoding system 24 from FIG. 2 with table 302 from FIG. 3.

Process 600 begins with a decoding module may be configured to identify a location on a first axis of the table using the number (step 602). In an aspect of the disclosure, the location on the first axis is identified by the number of leading bits in the variable length code (VLC). The table may be table 302 as shown in FIG. 3. For example, in the VLC of 11111001, the number of leading bits, if set to a 1, is five. There are five "1" bits that begin the VLC and are consecutive. In this example, the number is five. In another example, in the VLC of 01, the number of leading bits, if set to a 0, is zero.

There is a "0" bit that begins the VLC, therefore no leading bits of "1" exist in this VLC. In this example, the number is zero.

Then, the decoding module may identify a location on a second axis of the table using a string of bits in the plurality of bits (step 604). The string of bits is a portion of the plurality of bits that form the VLC. In an aspect of this disclosure, for example, in the VLC of 11111001, the first five bits are 1's and are leading bits. Then, the next bit of 0 is an indicator that the leading bits are done. After the indicator bit are the string of bits. In this example, the string of bits is the bits 01. In an aspect of the disclosure, the string of bits is three bits. Therefore, the decoding module will take the next bit in the bit stream after the VLC to form 01X where X represents a 1 or 0.

Finally, the decoding module may identify the code word using the location on the first axis and the location on the second axis (step 606). In an aspect of this disclosure, when the threshold is 9, the first axis will be the numbers 0-8 and the second axis will be the binary value of 0-7 (000, 001, 010, 011 ... etc.). Using the examples above, the code word, with five leading 1's and a string of bits equal to 01x, is 22. The code word 22 is applicable for both 010 and 011 as the string of bits. Thereafter, the process terminates.

Figure 7:
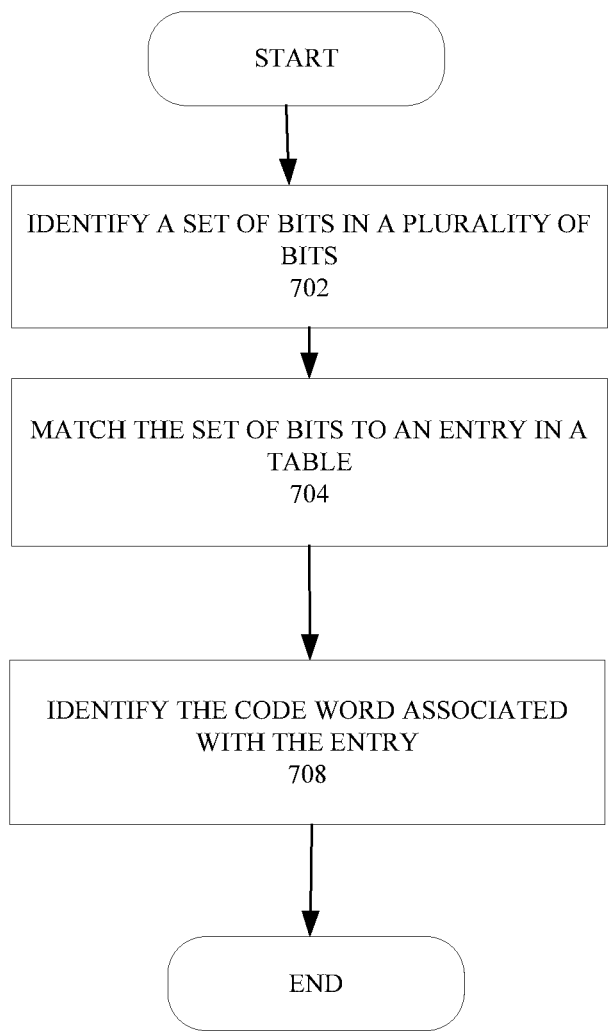
FIG. 7 is a flowchart for locating a code word in a table in accordance with an aspect of this disclosure.

FIG. 7 is a flowchart for locating a code word in a table in accordance with an aspect of this disclosure. Process 700 may be implemented in media decoding system 24 from FIG. 2 with table 402 from FIG. 4.

Process 700 begins with a decoding module may be configured to identify a string of bits in the plurality of bits (step 702). In an aspect of this disclosure, for example, in the VLC of 1111111110000011, the first nine bits are 1's and are leading bits. After the lead bits is the string of bits. In this example, the string of bits is the bits 0000011. In an aspect of this disclosure, the string of bits is always the bits following the first nine bits, up to seven. In another aspect, the string of bits may be a different size. Next, the decoding module may match the string of bits to an entry in the second table (step 704). For example, when the threshold is 9, all of the entries in the table will have at least nine 1's at the beginning. The string of bits may be matched with the bits following the nine leading bits. Finally, the decoding module may identify the code word associated with the entry (step 706). For example, 0000011 will be matched with the entry for 1111111110000011. Using table 402 from FIG. 4, 0000011 would result in a code word of 0a. Thereafter, the process terminates.

Figure 8:
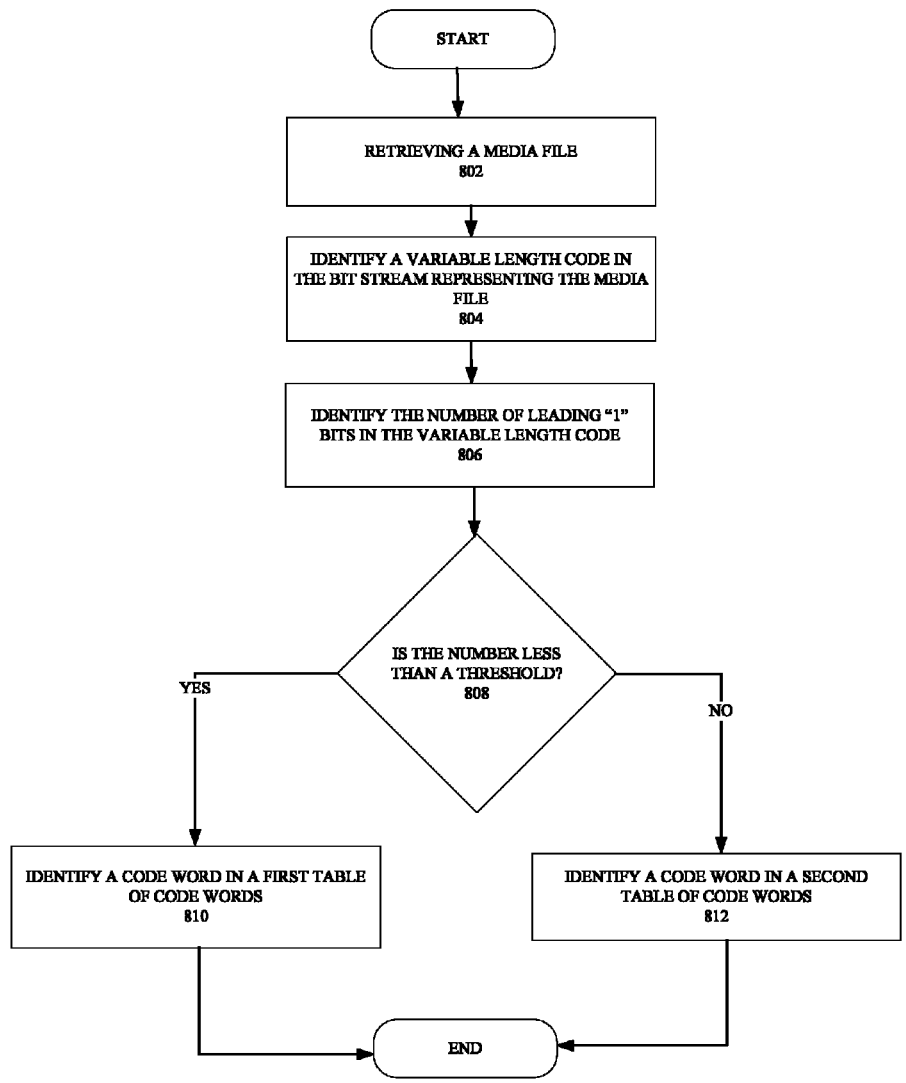
FIG. 8 is a flowchart for decoding a variable length code in accordance with an aspect of this disclosure.

FIG. 8 is a flowchart for decoding a variable length code in accordance with an aspect of this disclosure. Process 800 may be implemented in media decoding system 24 from FIG. 2.

Process 800 begins with a retrieving a media file (step 802). The media file may be an image file, such as a JPEG. The media file may be retrieved from a source, such as, for example, a storage device or the internet. The media file may be received as a binary bit stream. Next, the process identifies a variable length code in the bit stream (step 804). Then, the process identifies the number of leading 1's in the VLC (step 806). The lead bit may be predetermined to be one of a 1 or 0. In an aspect of this disclosure, the lead bit is a 1.

Then, a determination is made as to whether the number is less than a threshold (step 808). In an aspect of this disclosure, the threshold is 9. If the number is less than a threshold, the decoding module may identify a code word in a first table of code words (step 810). Therefore, in an aspect of this disclosure, if the number of lead bits (e.g. 1) is less than 9, then the first table is used. For example, if the 16-bit number is 1111101001011101 then the decoding module would access the first table to find the code word associated with this number. In this example, using the table in FIG. 3, the code word would be 71.

Alternatively, if the number is not less than the threshold, the decoding module may identify the code word in a second table of code words (step 812). Therefore, in an aspect of this disclosure, if the number of lead bits (e.g. 1) is equal to or greater than 9, then the second table is used. For example, if the 16-bit number is 1111111110000011 then the decoding module would access the second table to find the code word associated with this number. In this example, using the table in FIG. 4, the code word would be 0a. Thereafter, the process terminates.

Figure 9:
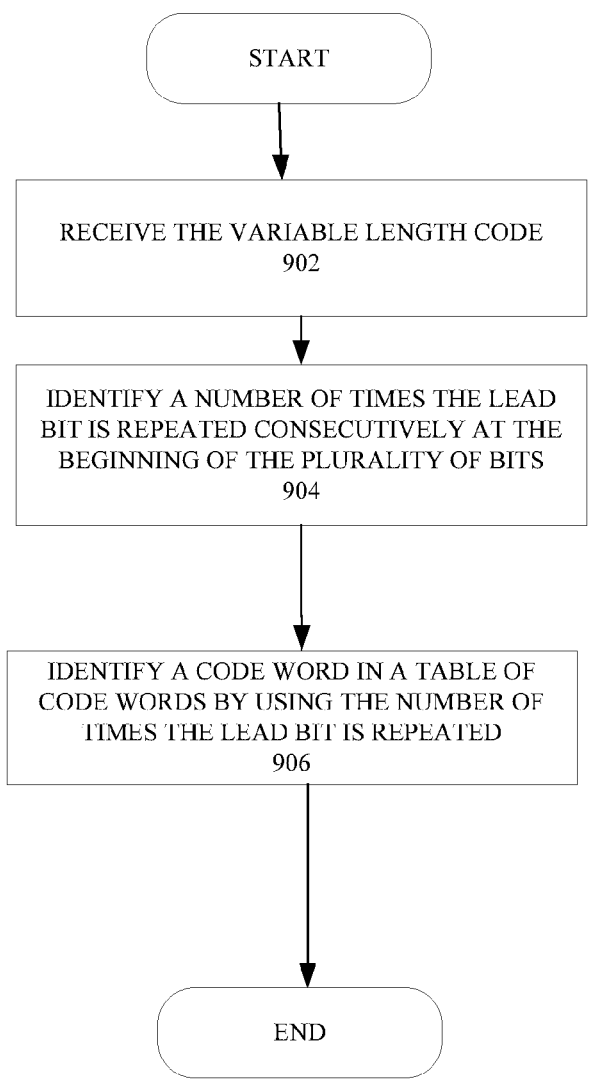
FIG. 9 is a flowchart for decoding a variable length code in accordance with an aspect of this disclosure.

FIG. 9 is a flowchart for decoding a variable length code in accordance with an aspect of this disclosure. Process 900 may be implemented in media decoding system 24 from FIG. 2.

Process 900 begins with a decoding module may be configured to receive the variable length code, wherein the variable length code is a plurality of bits (step 902). Next, the decoding module may identify a number of times the lead bit is repeated consecutively at the beginning of the plurality of bits (step 904). The lead bit may be predetermined to be one of a 1 or 0. In an aspect of this disclosure, the lead bit is a 1.

Then, the decoding module may identify the code word in a table of code words using the number of times the lead bit is repeated consecutively (step 906). Process 900 operates differently from process 500 in that only one table is used in process 900. The table used in process 900 is similar to table 302 from FIG. 3. However, the table in process 900 may be larger than table 302 from FIG. 3. The table used in process 900 may comprise all code words. When only one table is used, the table size may be 16×64 bytes which makes a table size of 1024 bytes. This size is still much smaller than 64 kB. Some of the table may be created from the following codes:

9 leading 1 bits, 6 extra bits:
111111111 0 00000 :0x82
111111111 0 000010 :0x09
:
111111111 0 111110 :0x92
111111111 0 111111 :0x93
:

15 leading 1 bits, 0 extra bits:
111111111111110 :0xfa

Thereafter, the process terminates.

The flowcharts and block diagrams in the different depicted aspects illustrate the architecture, functionality, and operation of some possible implementations of apparatus, methods, system, and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

What is claimed is:

1. A method for decoding a variable length code, the method comprising:
receiving the variable length code, wherein the variable length code is a plurality of bits;
identifying a number of times a lead bit is repeated consecutively at the beginning of the plurality of bits, wherein the lead bit is predetermined to be one of a 1 or 0; and identifying a code word in a table of code words by using the number of times the lead bit is repeated, comprising:
determining whether the number is less than a threshold; and
responsive to determining that the number is less than the threshold, identifying the code word in a first table of code words.

2. The method of claim 1 further comprising:
responsive to determining that the number is equal to or greater than the threshold, identifying the code word in a second table of code words.

3. The method of claim 2, wherein the step of identifying the code word in the second table comprises:
identifying a string of bits in the plurality of bits;
matching the string of bits to an entry in the second table; and
identifying the code word associated with the entry.

4. The method of claim 3, wherein the string of bits is seven bits after nine bits at the beginning of the plurality of bits.

5. The method of claim 1, wherein the step of identifying the code word in the first table comprises:
identifying a location on a first axis of the first able using the number;
identifying a location on a second axis of the first table using a string of bits in the plurality of bits; and
identifying the code word using the location on the first axis and the location on the second axis.

6. The method of claim 5, wherein any lead bits are followed by a 0 bit, and wherein the string of bits is three bits following the 0 bit.

7. The method of claim 1, wherein the threshold is 9, and wherein the lead bit is a 1.

8. The method of claim 1, wherein the variable length code is from an image file.

9. The method of claim 1, wherein the step of identifying the code word in the table comprises:
identifying a location on a first axis of the table using the number;
identifying a location on a second axis of the table using a string of bits in the plurality of bits; and
identifying the code word using the location on the first axis and the location on the second axis.

10. The method of claim 9, wherein any lead bits are followed by a 0 bit, and wherein the string of bits is any bits following the 0 bit.

11. A system for decoding a variable length code, the system comprising:
a memory unit;
a processing unit connected to the memory unit;
a decoding module configured to receive the variable length code, wherein the variable length code is a plurality of bits; identify a number of times the lead bit is repeated consecutively at the beginning of the plurality of bits, wherein the lead bit is predetermined to be one of a 1 or 0; and identify a code word in a table of code words by using the number of times the lead bit is repeated, comprising the decoding module being configured to:
determine whether the number is less than a threshold; and
identify the code word in a first table of code words in response to determining that the number is less than the threshold.

12. The system of claim 11, wherein the decoding module is further configured to:
identify the code word in a second table of code words in response to determining that the number is equal to or greater than the threshold.

13. The system of claim 12, wherein in identifying the code word in the second table, the decoding module is further configured to:
identify a string of bits in the plurality of bits;
match the string of bits to an entry in the second table; and
identify the code word associated with the entry.

14. The system of claim 11, wherein the threshold is 9, and wherein the lead bit is a 1.

15. The system of claim 11, wherein in identifying a code word in a first table, the decoding module is further configured to:
identify a location on a first axis of the first able using the number;
identify a location on a second axis of the first table using a string of bits in the plurality of bits; and
identify the code word using the location on the first axis and the location on the second axis.

16. A computer program product comprising logic encoded on a non-transitory computer-readable media for decoding a variable length code, the logic comprising instructions, to be executed by one or more processors, for:
receiving the variable length code, wherein the variable length code is a plurality of bits;
identifying a number of times a lead bit is repeated consecutively at the beginning of the plurality of bits, wherein the lead bit is predetermined to be one of a 1 or 0; and
identifying a code word in a table of code words by using the number of times the lead bit is repeated.

17. The computer program product of claim 16, further comprising instructions for:
determining whether the number is less than a threshold; and
responsive to determining that the number is less than the threshold, identifying the code word in a first table of code words.

18. The computer program product of claim 17 further comprising instructions for:
responsive to determining that the number is equal to or greater than the threshold, identifying the code word in a second table of code words.

* * * * *